United States Patent [19]

Difrancesco

[11] Patent Number: 5,430,614
[45] Date of Patent: Jul. 4, 1995

[54] ELECTRICAL INTERCONNECT USING PARTICLE ENHANCED JOINING OF METAL SURFACES

[75] Inventor: Louis Difrancesco, Hayward, Calif.

[73] Assignee: Particle Interconnect Inc., Hayward, Calif.

[21] Appl. No.: 148,907

[22] Filed: Nov. 8, 1993

Related U.S. Application Data

[60] Division of Ser. No. 951,860, Sep. 28, 1992, which is a continuation-in-part of Ser. No. 720,182, Jul. 22, 1991, which is a division of Ser. No. 479,696, Feb. 14, 1990, Pat. No. 5,083,697.

[51] Int. Cl.⁶ .................... H01R 23/68; H05K 1/14
[52] U.S. Cl. .................... 361/785; 174/260; 174/261; 361/761; 361/792; 361/803; 439/44; 439/65; 439/74
[58] Field of Search .......... 361/785, 760–764, 361/767, 784, 790, 792, 803; 174/256–261; 228/115–116; 29/846, 853; 156/60; 439/44, 65–66, 74

[56] References Cited

U.S. PATENT DOCUMENTS

| | | | |
|---|---|---|---|
| 3,359,145 | 12/1967 | Salyer et al. | |
| 4,157,932 | 6/1979 | Hirata | 428/1 |
| 4,814,040 | 3/1989 | Ozawa | 29/846 |

Primary Examiner—Bot L. Ledynh
Attorney, Agent, or Firm—Michael A. Glenn

[57] ABSTRACT

A method and apparatus for electrically interconnecting various electronic elements, including circuit components, assemblies, and subassemblies. A particle enhanced material metal contact layer, having a surface, formed on the electronic elements, includes particles of greater hardness disposed on and/or within the metal contact layer, which particles form protuberances that concentrate stress when the contact surface is brought into contact with an opposing surface under pressure, to thereby penetrate the opposing surface and form a metal matrix between the two surfaces. The invention includes preferred and alternative embodiments incorporating particle enhanced material that provide a semiconductor test array which may be patterned as desired to receive an integrated circuit die and/or packaged components to facilitate integrated circuit and packaged electronic component testing; a probing device for testing integrated circuit die in situ on a semiconductor wafer; connectors for coupling discontinuous circuit element substrates; an interposer for interconnecting conventional components, circuit boards, and assemblies; and connectors for single and multiple layer circuit boards.

12 Claims, 6 Drawing Sheets

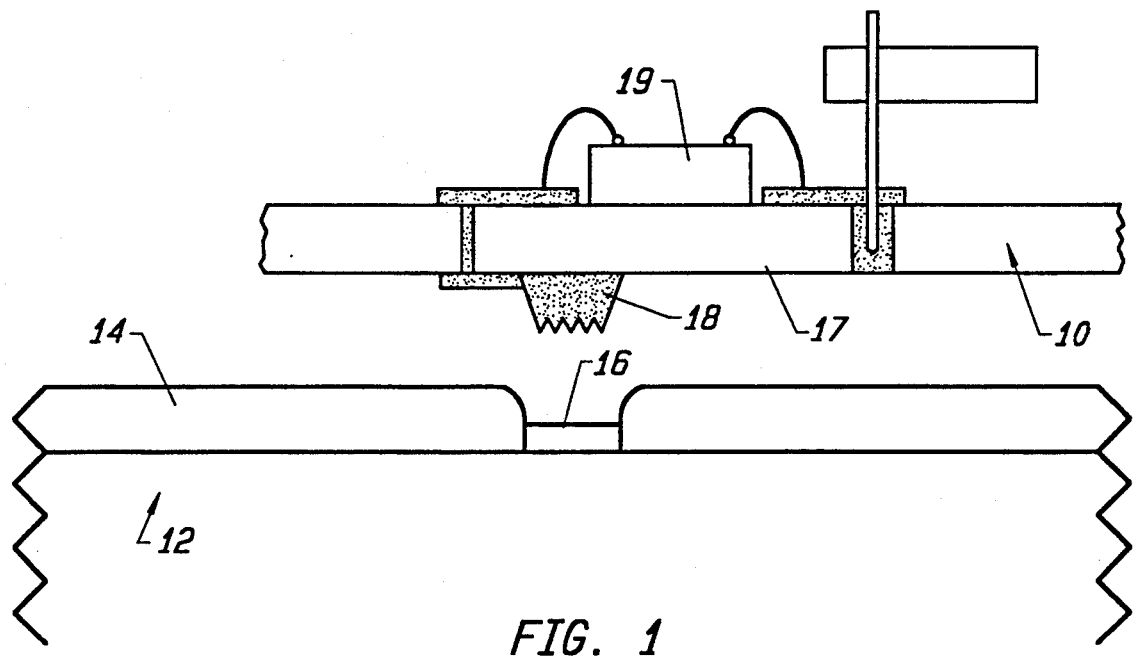
FIG. 1
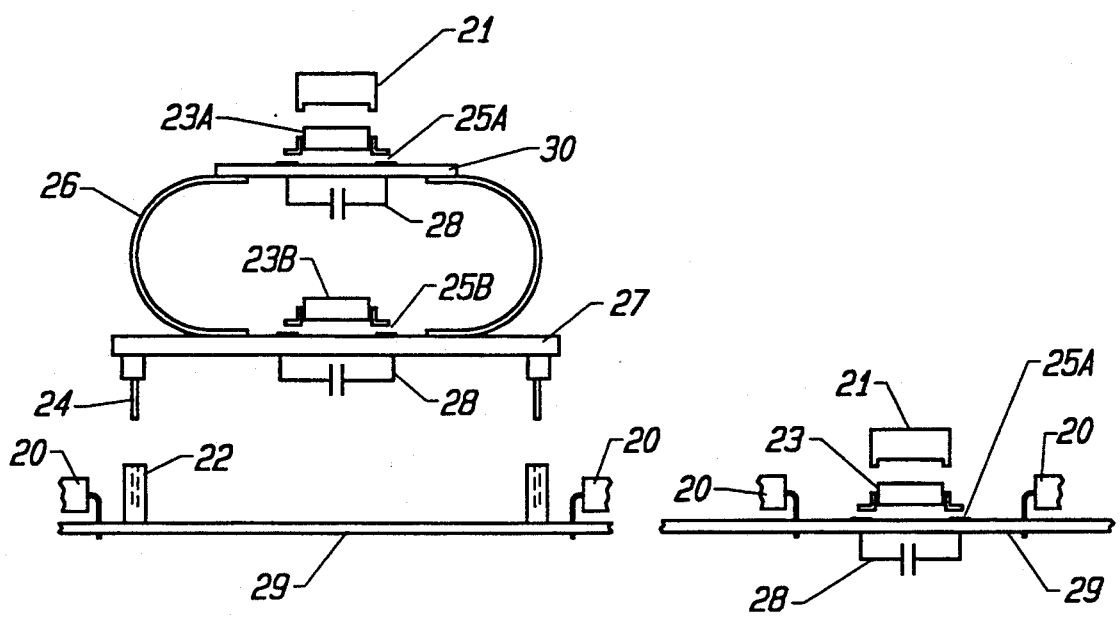
FIG. 2A
FIG. 2B

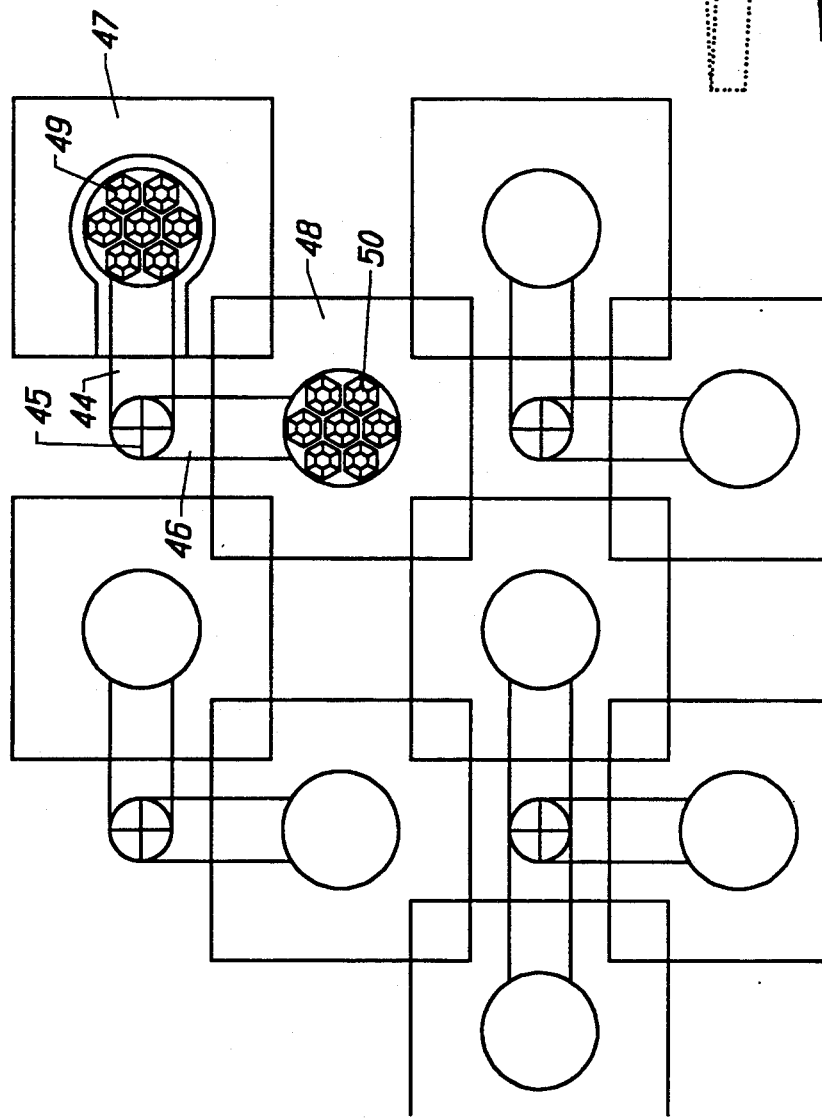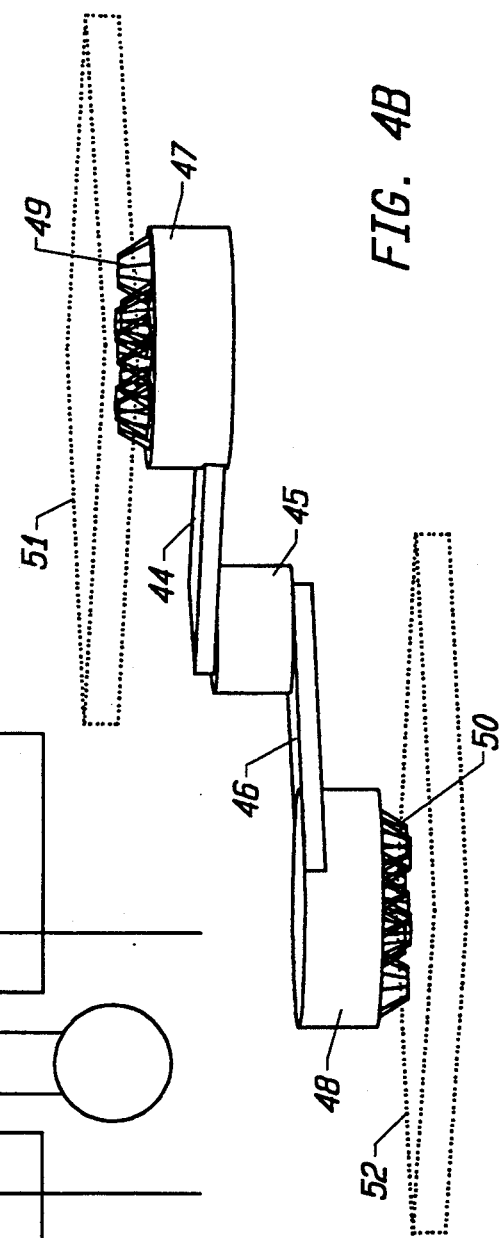

ELECTRICAL INTERCONNECT USING PARTICLE ENHANCED JOINING OF METAL SURFACES

This application is a divisional of application Ser. No. 07/951,860, filed 28 Sep. 1992, which is a continuation-in-part of U.S. patent application Ser. No. 07/720,182, filed 22 Jul. 1991, which is a division of Ser. No. 479,696 now U.S. Pat. No. 5,083,697, filed, 14 Feb. 1990 and issued 28 Jan. 1992.

BACKGROUND OF THE INVENTION

1. Technical Field

The present invention relates to electrical interconnections. More particularly, the present invention relates to electrical interconnections that are formed using particle enhanced joining of metal surfaces.

2. Description of the Prior Art

Interconnect technology has not kept pace with microminiaturization in the electronics industry. Thus, component packages and the connectors used to form an electrical and/or mechanical interface between various components and assemblies in electronic products are now the most expensive portion of such products. Component packages, connectors, sockets, plugs, and the like are also the bulkiest and heaviest portion of such products.

Conventional interconnect technology complicates the electronic equipment design and manufacturing processes by introducing special considerations into such processes with regard to component placement, heat generation, power loss, and signal propagation delay. In this way, potential gains in performance, realized by new and emerging technologies, are not fully exploited. Rather, such advances are negated or held back by such considerations as are mentioned above.

Conventional interconnect technology provides different approaches to interconnecting electronic components (each approach having variations that do not need to be discussed herein): the use of solder reflow to make permanent, low-ohmic connections; the use of wiping contacts to make temporary, medium-ohmic connections; the use of filled adhesives to make permanent, medium to high ohmic connections; and the use of sheet materials and other exotics to make medium to high ohmic connections. Each of these technologies is either approaching obsolescence in view of the continual production of improvements in electronic components, such as integrated circuits, or it has certain shortcomings that render its use limited or unreliable.

Solder reflow technology produces a metallic contact of moderate strength, but requires that the bonded surfaces (and surrounding areas) be subjected to high heat. Such thermal stress tends to weaken or damage the components joined and therefore results in higher initial and long term failure rates. Solder bonds are easily fractured under moderate stress and, if the bonds are not formed under strictly controlled conditions, they are subject to producing cold (i.e. high ohmic, low mechanical integrity) connections.

To form a bond using solder reflow it is necessary to prepare the surface to be bonded with highly corrosive and environmentally hazardous fluxes. After the bond is formed, such fluxes must be cleaned from the surface of the electronic assembly.

Although solders are known that do not require cleaning after a bond is formed, such solders either require special atmospheric conditions to be used, or they must be used in conjunction with special fluxes. Thus, such alternative soldering approach is both expensive and of uncertain reliability.

Solder bonds cannot be formed in a uniform fashion. For example, voids often occur within the bond. Thus, solder bonds must be visually inspected after the bond is made. If the bond is inadequate, it must be reworked, if possible. Such rework is a labor intensive activity that runs the risk of damaging the circuit board and neighboring components on the circuit board.

To use solder reflow technology it is also necessary to purchase and maintain several large pieces of expensive machinery and test equipment. Accordingly, solder reflow technology requires several process steps and implementing equipment, adding to the expense of manufacturing electronic products, while unnecessarily limiting plant throughput.

A solder bond is a permanent bond, and reworking a circuit assembly to remove and replace a defective component subjects the entire assembly, and especially the area around the defective component, to elevated temperatures, which results in additional thermal stress. The solder contacts themselves take up significant space on a circuit board and thus artificially limit the absolute component density that would otherwise be possible, for example on a circuit board. As the solder used in solder reflow is only available in a limited number of materials, the continuing introduction of incompatible materials means that there are fewer designs to which solder reflow can be applied.

Wiping action interconnect technology (e.g. sockets, plugs, needle pins ect.) forms a temporary electrical interconnection and thus readily allows the remating of various components and assemblies (for example, when replacing a defective component). A problem with using such technology is that it is subject to the persistent formation of oxides along a contacting surface, which increases contact resistance. In time, these oxides build up, hastening connection failure and thus equipment failure.

Wiping action technology is only available in the form of various connectors and sockets, etc. These devices usually provide a contact surface formed from a limited range of special metals, alloys, and other expensive materials as are suitable for maintaining a sliding connection. The devices themselves have interfering electrical properties due to their size, orientation on a circuit board, etc. and thus degrade signal propagation through the interconnect (by introducing resistive, capacitive, and inductive components into the signal path).

Wiping action technology provides high ohmic connections that produce excessive and unwanted heat, and therefore contribute to equipment failure while wasting energy. The wiper mechanism, for example a socket, requires significant space on a circuit board. Thus, potential circuit operating speeds are degraded due to propagation delays (i.e. the time it takes a signal to traverse a greater distance). Sockets, plugs, and the like are only available in a limited number of configurations and materials. Thus, the evolution of electronic technology is constrained by the limitations wiper interconnects impose upon a designer.

Additionally, wiper interconnects are highly unreliable. A punishing environment, for example one subject to intense vibration, temperature extremes, and/or high levels of contamination (e.g. that in which a laptop computer is used), tends to disrupt the continuity of connections made at a wiper interconnect. As wiper interconnects are mechanical devices they corrode and are subject to wear. Thus, they only have a limited useful life.

Filled adhesives generally provide a binder and a conductive filling, such as silver or gold. These materials are unsuitable for most interconnect applications because they form permanent medium to high ohmic connections.

Sheet materials and other exotic interconnect media are largely untested in most interconnect applications. Accordingly, the reliability of such materials is questionable. Typically, a sheet material provides an elastic matrix having the ability to form spaced conductive pathways therethrough. Conduction in such materials is provided by a string of conductive particles, microwires, and the like. Such materials are expensive, show temperature induced changes in physical properties (i.e. they are rigid when cold and soften when heated), are prone to shorting and therefore unreliable, and they typically provide only medium to high ohmic connections.

Examples of such exotic interconnect technology include the following: 3M Corporation of Minneapolis, Minnesota provides a material consisting of diamond particles in a polyamide binder; Nitto Denko Company of Japan provides a circuit board material having conductive bumps on either side which are interconnected by vias and which form a connection under conditions of extremely high pressure; and Digital Equipment Corporation of Maynard, Massachusetts provides silicon backed polyamide thin film deposited metal circuit boards.

SUMMARY OF THE INVENTION

The present invention provides several improved electrical interconnect devices using particle enhanced joining of metal surfaces. In particle enhanced joining technology, particles at or near a surface layer of an object provide a protuberance which concentrates stress to penetrate opposing, mating surfaces of another object and form a bond therebetween. Such particles may have any hardness that is at least slightly greater than that of the layer to be pierced. Thus, temporary or permanent interconnections may be formed, with or without the application of heat, and (because devices produced in accordance with the teachings of the present invention may be formed by patterning) without the need of providing bulky connectors and the like. Accordingly, a wide range of reliable and inexpensive interconnecting devices are possible that are not subject to the limitations of solder reflow, wiping action, filled adhesive, or other interconnect technology.

The present invention applies particle enhanced joining technology to advantage by providing various devices for forming electrical connections between the many various components, subassemblies, and assemblies that are now, or will be, used in the electrical and electronic arts. Thus, the present invention finds application in forming temporary and/or permanent electrical connections, in any combination, between, integrated circuit die, packaged die, circuit boards, including single and multiple layer circuit boards and flexible circuit boards, load boards, probe cards, multichip packaged die, wire, cables, terminal strips, terminal lugs, spade connectors, switches, high power interconnect, crimps, etc.

In the preferred and alternate embodiments of the invention, an electrical connection may be formed without the application of heat, but rather through the application of pressure between two or more elements to be bonded. Due to the piercing action of the particles used in the present invention, some embodiments of the invention allow a mechanical bond to be provided by any of various adhesives, without interfering with the electrical connection formed. Other embodiments of the invention take advantage of the ability of enhanced particle materials to pierce through films and the like and thus provide an inert atmosphere environment when the metal matrix formed by the piercing action of the enhanced particle material also encapsulates the matrix in an adhesive or film binder.

In one embodiment of the invention, a load board, such as is used to interface a packaged integrated circuit or integrated circuit module to a tester, is provided with a receptor site formed from particle enhanced material. Thus configured, multiple test operations are possible wherein the load board has a vastly improved useful life. This embodiment of the invention may also include particle enhanced material at the interface of the load board to a tester input cable.

An alternative embodiment of the invention replaces the pins on a probe card, such as is used to test semiconductor die in situ on a semiconductor wafer, with test contacts formed of particle enhanced material. This embodiment of the invention improves testing accuracy and obviates the need frequently to repair or replace probe pins, as is necessary with conventional probe card technology.

Another embodiment of the invention provides an interposer, wherein conventional components which are designed for use with solder reflow or wiper interconnect, for example a die and a circuit board, may be reliably interconnected. In this embodiment of the invention, a layer of particle enhanced material is provided on a surface of at least one of the components to be bonded. For example, a layer of particle enhanced interconnect is provided on a circuit board such that a conventional die is interconnected thereto without the use of solder reflow or wiper interconnect. Alternatively, a substrate may be provided having a corresponding particle enhanced pattern on each side thereof, such that an interface layer is provided between two conventional materials. In this embodiment of the invention, a conventional die is interconnected, for example, to a conventional circuit board by a double sided layer of particle enhanced material. In this way, an alternative to standard lead frames is provided.

Yet another embodiment of the invention provides an edge connector, for example for providing an offset in a flex circuit, such that continuity is assured between discontinuous surfaces of multiple component carriers. Alternate embodiments of the invention provide a single surface including particle enhanced material formed thereon for connecting one substrate to another; and a coupler, which may be made of flex board material, in which both surfaces thereof have a layer of particle enhanced material formed thereon. In this embodiment of the invention, two circuit boards, for example, may be electrically interconnected along a flexible joint (e.g. a hinge in a laptop computer lid/display).

Another embodiment of the invention provides a planar pin-out high I/O count connector for a single layer or a multilayer circuit board, wherein the pin out is formed from patterned particle enhanced material. In this embodiment of the invention, extremely fine line spacings are possible, such that heretofore unachievable high levels of pin-out density are provided at low cost.

Another embodiment of the invention provides a spaced structure, including parallel spaced sheets, in which particle enhanced material is used to provide microspacers having an exceptional bond capability and providing extremely close spacings. It has been found that this embodiment of the invention is useful for producing heat exchangers, batteries, fuel cells, capacitors, etc.

BRIEF DESCRIPTION OF THE DRAWINGS

FIG. 1 is a schematic cross section view of a probe card incorporating a particle enhanced interconnect according to a preferred embodiment of the present invention;

FIGS. 2a-2b show a series of schematic cross section views of various load board configurations incorporating a particle enhanced interconnect according to an alternative embodiment the present invention;

FIGS. 4a-4b are a schematic plan and a cross section view of an offset coupling in a flex circuit incorporating a particle enhanced interconnect according to another embodiment of the present invention;

DETAILED DESCRIPTION OF THE INVENTION

Figure 3:
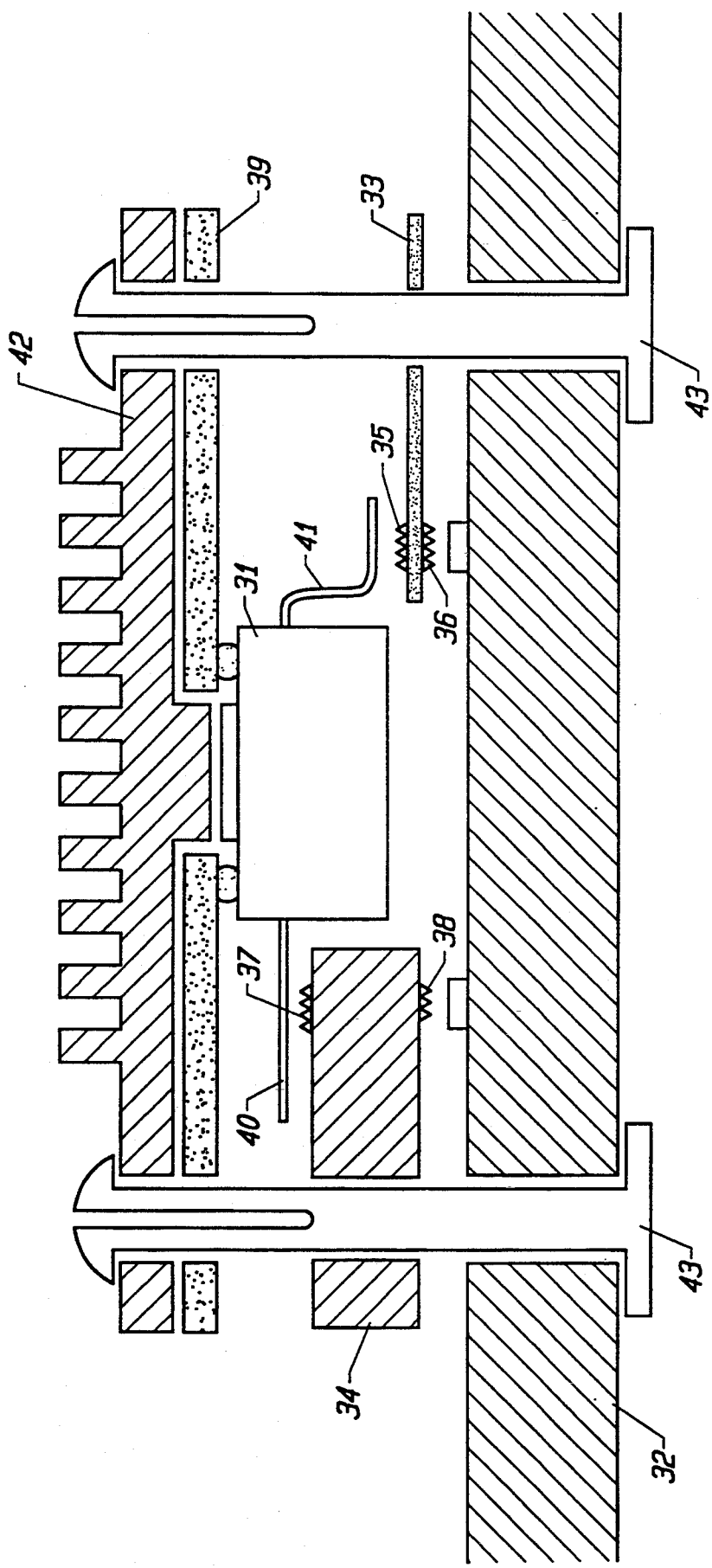
FIG. 3 is a schematic cross section view of various interposer applications incorporating a particle enhanced interconnect according to another embodiment of the present invention.

The present invention is best understood by referring to the Drawings in connection with review of this Description. The present invention provides an electrical interconnect using particle enhanced joining of metal surfaces. Particle enhanced joining, also referred to as particle interconnect technology, is described in U.S. Pat. Nos. 4,804,132 and 5,083,697, and in pending U.S. patent application Ser. No. 07/720,182, the contents of which are incorporated herein by this reference thereto.

Briefly described, particle interconnect technology allows two surfaces to be bonded together without the application of heat. Such bonding occurs when the two surfaces having an outer metal layer are brought together under pressure, such that hard coated particles which protrude from at least one of the surfaces concentrate stress to pierce the other surface and thus form a metal matrix. The surfaces or their supports may be bonded mechanically through any conventional means, such as with adhesives, clamps, etc.

The present invention recognizes various advantages to which particle enhanced materials can be put to provide improved electrical and electronic interconnects. Some of the properties of particle enhanced materials which make their use advantageous in making these improved interconnects include the ability to form temporary or permanent connections as desired. Thus, particles may be added to a solder compound. After a connection is confirmed, heat is applied to flow the solder and make the connection permanent.

Alternatively, particle enhanced material provides a nonwiping, and therefore less destructive, contact and is well suited for the fabrication of connectors, etc. and for the fabrication of contact devices, such as switches, breakers, and the like.

Particle enhanced materials may also be used in extremely high power applications where a low ohmic contact means a substantial savings in energy that would otherwise be lost as heat at a high ohmic connection. It has been found that particle enhanced materials are particularly well sited for use on the interior contacting surface of high voltage crimping. In addition to forming a superior, low ohmic connection, particle enhanced materials provide a reliable mechanical bond that reduces the likelihood of a stressed cable slipping out of its crimping. Particle enhanced materials are also useful in making superior connections through crimping and the like in household wiring as well.

It should be noted that the particles in particle enhanced material may be chosen for various properties as the application to which they are put may demand. Thus, electrical and thermal conduction and insulation are all proper applications for particle enhanced materials.

Particle enhanced materials are easy to clean by reflow, scrubbing, ultrasonic cleaning and any other cleaning technology.

Particle enhanced materials may be inspected before they are used to form a bond and the reliability of a bond to be formed is therefore readily predicted. Such inspection techniques include visual inspection, e.g. by optical methods, and mechanical inspection, e.g. by pressing the surface of the connector to a piece of foil, such as aluminum foil, to detect if particle density and activity is within a desired range.

Particle enhanced materials have the ability to pierce not only an opposing metal surface, but also layers of materials or contaminants that may be interposed between the two metal surfaces that are to be bonded. For example, particle enhanced materials may pierce films, passivation layers, polyamide, grease, fingerprints, adhesives, etc., such that the likelihood of forming a poor connection due to contamination is substantially reduced.

The present invention exploits this ability of particle enhanced materials to pierce through various layers of materials, etc. by providing the capability of coating surfaces to be bonded with an adhesive, or by placing a membrane between the surfaces prior to bonding, such that, when pressure is applied, the adhesive or membrane is forced into the interstices within the metal matrix, thus isolating the contact from the ambient in a microenvironment.

The particles in particle enhanced material possess the unique property of concentrating stress at a particle point. This allows the piercing action described above. The present invention thus allows a diffusion bond to be formed between two surfaces, e.g. aluminum-aluminum. To make such a bond with the present invention the two surfaces are brought together under conditions of high pressure and elevated temperature for an extended period of time. As time and temperature are dependent variables, either can be increased or decreased as necessary without sacrificing the bond produced. It has been found that this aspect of the present invention allows the production of integrated circuits having smaller bond pads. Thus, device density on a die may be increased.

Enhanced particle materials are typically formed as follows: A diamond crystal of 0.000880" to 0.001080" (22 to 27 microns) in diameter is coated with a hard metal. In such process, bare copper printed circuit board traces are masked, except those areas where particles are to be deposited. A plating tank is then attached over the printed circuit board. Particles are added to the plating tank and settle down onto the copper traces. Nickel is then electroplated over the particles, gluing them to the trace. The nickel acts like an adhesive and provides a base for other metals. Nickel is also an excellent contact.

Other metals that may be used for such operation include copper, tin, lead tin, hard gold, soft gold, etc. It is important to note that a wide range of materials may be used in the present invention. The materials are chosen for their properties as most materials work well with particle enhanced technology. Thus, metals may be chosen for their ability to conduct electricity, and/or, where applications demand, heat; and for their ability to resist corrosion, form or not form diffusion welds, and exhibit or not exhibit voltaic action.

Very favorable results are obtained when particles are plated onto a surface as described above. Once plated, the enhanced particle contact is ready to use, or it can be plated, for example with gold, solder, etc., depending on the requirements of the application. The foregoing process allows the application of a very even coating. Thus, contacts may currently be plated with leads as small as 0.010" pitch.

In alternative embodiments of the invention, the particles can be mixed with solder paste and then screened onto a printed circuit board. Enhanced particle contacts may be screened onto soldered plated traces when the device lead pitch is 0.020' or larger. In such application, particles are mixed with solder paste, then this mixture is screened unto the printed circuit board. Next, the solder is melted and the particles are attached to the trace.

In another embodiment of the invention, particle enhanced material can be applied by electrostatic techniques. That is, a pattern may be formed on a charged surface of an electrostatic device, much like with the drum of a photocopy machine. The particle enhanced material is then picked up by the charged surface and transferred to a substrate, such as a circuit board.

Alternatively, an offset printing technique may be used where particle enhanced material is mixed with an ink resin or is provided in the form of an organo-metallic ink. The particle enhanced material is then patterned by standard printing techniques. It has been found that this embodiment of the invention, when practiced with roll or sheet substrate materials, provides exceptionally fast throughput. Standard printing speeds (typically 88 feet/second, i.e. 60 MPH) may be achieved by this technique.

In both the electrostatic and the offset printing embodiments of the invention a programmed image for patterning the particle enhanced material may be directed to the printer from a source file, thereby obviating the need for intermediate masks and the like. Resolution achieved by these techniques is on the order of 600 DPI—that is, a 2-mil resolution is achieved.

Finally, patterning techniques for applying particle enhanced material may also include various plating technologies (e.g. techniques used for lead frame plating, TAB technology), the use of thick film screenable inks, vacuum deposition, fluid media techniques, such as liquid or gaseous deposition, standard semiconductor patterning techniques, etc.

When the above process is complete, a field is thus produced having in excess of 500 minute sharp points in an area of 0.100' by 0.100". When a device is placed on top of these points and pressure applied, the amount of contact force required to puncture the oxide layer on the device's leads is only a few grams. Thus, enhanced particle materials perform like a small bed of nails or a thumbtack. The present invention applies such material qualities to provide test fixtures built with essentially zero lead length between the test circuit and the device under test. The present invention makes it possible to eliminate traditional test sockets, daughter boards, flex circuits, and all types of adapter hardware. Thus, in one embodiment of the invention the device to be tested may be connected directly into a load board and tested.

There is virtually no contact wiping action with enhanced particle contacts since the method of contacting in such materials involves a puncture contact. As a device is pressed down onto the contacts, the particles in the material penetrate any oxides that may be present on the device's leads. Typical particle penetration depth is 5 to 10 microns.

One advantage of zero wiping action is that no metal is removed from the leads of the device being contacted. Therefore, the contact site remains clean. Accordingly, test probes and switch contacts do not accumulate contaminants and thus require less frequent cleaning than conventional test probes. Testing a device by inserting the device into a conventional test socket destroys the device leads after a few hundred insertions. It has been found that testing with the probes of the present invention allows in excess of 100,000 contacts without substantially degrading the device leads.

The following typical specifications apply with regard to contacts formed in accordance with the present invention for use with the various embodiments of the invention described herein. It should be understood that such specifications are given by way of example only and are not intended to limit in any way the scope or breadth of the invention.

Contact lead length: 0.001"
Final contact material: nickel, tin/lead solder. gold, copper, lead/indium solder, aluminum, titanium, etc.
Contact substrate material: FR-4, polyamide, ceramic, teflon, beryllium/copper, phosphorus/bronze, etc.
Smallest contact area: currently—0.005" by 0.015", suitable for devices with leads on 0.010" pitch. Smaller contacts are possible.
Contact force: Per lead—under 5 grams
Initial contact resistance: under 5 milliohms
Contact resistance after 1.5M contacts: under 5 milliohms
Contact capacitance: approaches 0
Contact inductance: approaches 0
Contact leakage: 0, pin to pin insulator, air. Any leakage comes from substrate materials.

Number of contacts on an individual device without any lead damage or solderability damage: 10,000 minimum Contact life: 1,000,000 contact minimum, tested at over 3,000,000 contacts Wiping action: approaches 0, puncture type contact Number of contact points per 0.100" by 0.100" area: above 500 points Contact temperature range: limited only by substrate materials; +300° C. to −150° C. est.

Current rating: PLCC samples tested to 2 amps @ 28 VDC per pin

Frequency response: tested to 800 MHz

The present invention exploits the unique qualities of particle enhanced materials to provide improved interconnect devices, as described below in the following exemplary embodiments.

FIG. 1 shows a schematic cross section view of a probe card 10 incorporating a particle enhanced interconnect according to a preferred embodiment of the present invention. A probe card is used to test integrated circuit die in situ on a semiconductor wafer. The present invention is useful in such application by providing a superior interconnect surface. The prior art approach of using a probing needle pin is replaced in accordance with the teachings of the present invention by a layer of enhanced particle material formed on a probe contact surface 18.

Silicon die 12 are normally manufactured with a 4 mil square pad 16 with between 1 and 2 microns of aluminum metalization. When exposed to the atmosphere, the pure aluminum forms an aluminum oxide barrier of approximately 50 Å. The pad is normally surrounded by a passivation layer 14 ranging up to 1 mil in thickness. Accordingly, a probe must electrically contact a 4 mil square pad and pierce the aluminum oxide while reaching 1 mil below the surrounding surface.

A probe for a probe card is produced as follows: for metalization, a thin-film lift-off process, or plate-up process is used. A substrate 17 is initially uniformly sputtered. Then a photomask is applied and a conductor is formed in the openings of the photomask. The walls of the photomask contain the contours of the signal paths. A photomask is applied with openings at the probe point locations. Thus, the signal conductors are protected from the nickel-diamond particles which are to be applied at the probe pads.

The substrate is immersed in a solution of boric acid, nickel chloride, nickel sulfate, and diamond particles. The diamond particles are transported and trapped in the nickel matrix by an electroplating process. Following the electroplating step, the photomask is removed and the thin, sputtered-only layers are etched away. This process minimizes the undercutting of the nichrome and nickel layers. Diamond particles used have a nominal size of 400 μinch (10 micron).

A wafer probe card 10 produced in accordance with this embodiment of the present invention provides the capability of testing high pin count die and multiple die on a wafer at frequencies in excess of 250 MfHz. The number of die that can be simultaneously tested is limited only by the capability of the tester used to provide pin electronics, and by the ability of the tester to perform die-to-die electronic switching, multiplexing, or simultaneous testing. If desired, tester electronics 19 may be integrated into the probe card itself to reduce error introduced by impedance mismatch, propagation delay, etc. The present invention provides a probe card that is a replacement for standard probe cards, and can be produced in any format presently in use, such that the invention may be practiced in present test equipment.

FIGS. 2a–2b show a series of schematic cross section views of two variations on load board configurations incorporating a particle enhanced interconnect according to an alternative embodiment the present invention.

FIG. 2a shows a direct replacement contact for a standard load board, in which the contact is formed from particles enhanced material. The load card 29 includes various active components 20, a socket ring 22, and receives an adapter printed circuit board 27 through engagement of pin ring 24 with socket ring 22. A flex circuit 26 is provided which couples a test site board 30 to the adapter printed circuit board 27. The present invention replaces the flexible metal pins typically used on conventional load boards with contacts 25a made of particle enhanced material.

In operation, a device under test 23a is contacted to the particle enhanced contacts 25a and pressure is applied by a back plate 21 to complete the connection. A bypass capacitor 28 is provided to debounce the connection. Alternatively, a device under test 23b may be contacted to particles enhanced contacts 25b formed directly on the adapter printed circuit board 27.

FIG. 2b provides a load board suitable for use at ultra high frequencies. In this embodiment of the invention, particle enhanced contacts 25 are formed directly on the load board 29 to minimize error introduced by the test jig. It should be noted with regard to the embodiments of FIGS. 2a and 2b that lead lengths and contact size is minimized. Additionally, the load board is vastly simplified.

One of the reasons that the present invention provides a significant improvement over conventional load boards is that it is necessary to build 'controlled impedance' test circuits when using conventional test sockets, adapters, and load boards. The point of providing a controlled impedance is to make the effects of resistance, capacitance, and inductance as constant as possible for every lead on a device to be tested. Thus, a controlled impedance is actually a controlled error, introduced to eliminate the added impedance effects caused by the test fixture and thereby provide a truly high frequency contact.

The typical resistance of a test socket begins at approximately 30 milliohms. An enhanced material test socket begins with approximately 3 milliohms of resistance. As a conventional test socket begins to wear out, the contact resistance starts to increase such that contact resistance over several hundred milliohms are not uncommon. By the time a conventional test socket has been cycled 10,000 times, it begins to totally fail in an exacting test application. In contrast, enhanced particle contacts have been contacted in a load board application for over 1,500,000 tests and the contact resistance has nonetheless remained under 3 milliohms. Thus, resistance need no longer be a consideration in designing a test device.

Capacitance and inductance of a conventional test socket and associated adapter hardware are a major impediment for fast test applications. Since an enhanced particle contact is only about 0.001' long, the enhanced particle contact itself does not add a capacitive or inductive element to a test circuit. Because of the extended life of an enhanced material contact, the contacts may be applied directly to the load board of the tester and the test circuitry may be placed within 0.100" of the leads of the device being tested.

It is also possible (as with a probe card application) to place the test circuitry on the back side of the load board directly under the device being tested. Thus, capacitive and inductive effects caused by the hardware associated with conventional test sockets are eliminated and a truly high frequency test site is provided.

It is also possible to build test sockets in any desired configuration using the teachings of the present invention. For example, 20/28/32/44 pin PLCCs, 20/28/32/44 pin LCCs, and standard 44 pin Yamachi PLCC test sockets have all been produced using enhanced particle materials.

FIG. 3 is a schematic cross section view of various interposer applications incorporating a particle enhanced interconnect according to another embodiment of the present invention.

An interposer is a device that allows conventional components, assemblies, and subassemblies to be interconnected in any combination without the need to retool the components, assembly, or subassembly. Thus, the interposer provides a powerful mechanism for overcoming the limitations of conventional interconnect technology within the technical confines imposed by conventional components, et al.

This embodiment of the invention is best understood with reference to FIG. 3, in which a layer of particle enhanced material is provided on a surface of at least one of the components to be bonded. For example, a layer of particle enhanced interconnect 35/36/37/38 is provided on a circuit board 33/34 such that a device 31 having conventional leads 40/41 is interconnected thereto without the use of solder reflow or wiper interconnect. A substrate may be provided having a corresponding particle enhanced pattern on one side thereof or on each side thereof, such that an interface layer is provided to one conventional material or between two conventional materials.

In the embodiment of the invention shown in FIG. 3, a conventional device is interconnected, for example, to a conventional circuit board 32 by a double sided layer of particle enhanced material. The device 31 is mounted to a carrier 39 and is urged into contact with each interposer 33/34 by a pressure plate 42, which is held down by alignment pins 43.

It is important to note that for purposes of illustration of the versatility of the present invention, a first device lead 40 of the type that would be used in a leadframe is shown and that a second device lead 41 of the type that is a pin is shown. The present invention works equally well with any lead arrangement.

It is also important to note that device 31 is mounted to a carrier 39. The device/carrier combination could also be a packaged die where leads 40/41 are the package leads. Thus, a packaged device may also be used in conjunction with and benefit from this embodiment of the invention. Likewise, the device/carrier combination could be a semiconductor die, where leads 40/41 are die bonding pads or bumps. The device/carrier combination could also be a printed circuit board. etc.

It is also intended that the scope of the invention includes applications such a leadframes, where a die is connected to a leadframe through a particle enhanced material coating; single and multichip modules, where contacting with the package is provided by a particle enhanced material coating; etc.

Additionally, it is intended that the invention include interposers made of flex material for interconnecting two or more discontinuous substrates as a hinge. For example, the present invention could provide the interconnect between an LCD matrix and a CPU board in a swing up display lid on a laptop computer. Interposers made in accordance with the teachings of the present invention find application in any conventional circuit board structures, including for example air bridges, microstrip constructions, cantilevered boards, cut-away boards, etc.

Also, interposers having particle enhanced contact on one or both sides, along any or all edges, may be provided as either rigid or flexible parallel, spaced, or offset interconnects for joining two components, assemblies, or subassemblies in any desired combination.

Additionally, an interposer or substrate may be provided with a rigid support, wherein bonding pressure, device travel, or lead flexure is monitored to determine coplanarity of leads in a device bonded to the interposer or substrate. Thus, a coplanarity tester is taught in which the completion of a bond (contact established) for each lead of a subject device serves as a set point for that amount of noting pressure, etc. that is necessary to establish the bond. This figure is then compared to predetermined normal figures and deviation (e.g. lack of coplanarity) may be calculated.

Additionally, although the embodiment shown in FIG. 3 provides a temporary interconnection. It is possible to form a permanent connection with the present invention, for example if a device is tested and found to be acceptable. In such embodiment of the invention, the particle enhanced contacts 35/36/37/38 are formed with a solder base. If a connection is to be permanent, it need only be heated to reflow the solder. Otherwise, the connection is temporary.

FIGS. 4a–4b are a schematic plan and a cross section view of an offset coupling in a flex circuit incorporating a particle enhanced interconnect according to another embodiment of the present invention. Thus, a highly compliant interconnect is shown, as is described below.

Referring to FIGS. 4a and 4b, an interconnect pattern is shown formed on a flexible substrate. In the Figs., an upwardly facing particle enhanced contact 49, formed on a rigid support 47, is shown connecting to a first component, etc. 51. A downwardly facing particle enhanced contact 50, formed on a rigid support 48, is shown connecting to a second component, etc. 52. It can be seen from FIG. 4a that such contacts are formed in a spaced array where an upwardly facing contact is staggered from a downwardly facing contact.

The area about the contact supports 47/48 is limited to approximately that of the contact itself. Each contact array and its support is adhered to or otherwise formed on a flex support 44/46, which in turn is adhered to or otherwise formed on either side of a rigid support 45. Thus, each contact array is flexibly cantilevered about a central rigid pivot point. The significance of this structure is that an extremely compliant interconnect is provided that is capable of producing high integrity, low ohmic connections. This embodiment of the invention finds application as a lead frame substitute, a chip carrier, etc.

In particular, a carrier made in accordance with the teachings of this embodiment of the invention deflects to contact leads on irregular component, damaged leads, bent leads, etc. The compliance of this carrier also allows deflection to comply with a warped board. Additionally, the present carrier provided a low cost device for mounting components having leads that are easily damaged and is thus a safety carrier.

Figure 5:
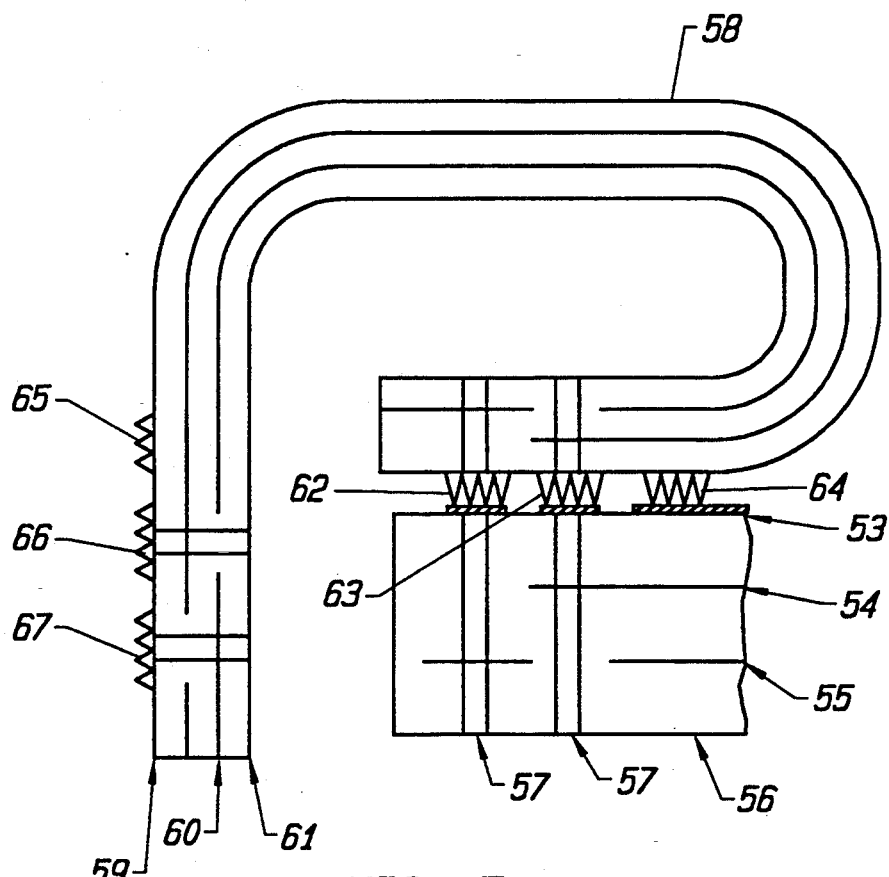
FIG. 5 is a schematic cross section view of a multilayer circuit board incorporating a particle enhanced interconnect according to yet another embodiment of the present invention

FIG. 5 shows a schematic cross section view of a multilayer circuit board incorporating a particle enhanced interconnect according to another embodiment of the present invention. In the Fig., a printed circuit board 56, consisting of multiple layers 53/54/55, each layers providing a wiring pattern, is shown connected to an edge connector 58. The edge connector 58 has corresponding multiple conducting layers 59/60/61. The connector 58 is interconnected to the printed circuit board 56 by particle enhanced contacts 62/63/64, which each correspond to a wiring layer within the printed circuit board. Thus, the first layer 53 of the printed circuit board is interconnected to the connector by contact 64. The second and third layers 55/56 of the printed circuit board are interconnected to the connector by contacts 63/62, respectively. Vias 57 are provided to route the inner printed circuit board wiring planes to the board surface. Particle enhanced material is also shown providing cable contacts 65/66/67.

It should be appreciated that FIG. 5 only shows an example of a printed circuit board connector made in accordance with the teachings of the present invention. The present invention is deemed to include many variations to the exemplary embodiment, such as providing particle enhanced materials as contacts on one the printed circuit board surface, on the connector, and on both. The invention may be used with edge connectors, as well as connectors placed anywhere deemed appropriate on a printed circuit board, e.g. in the center. The present invention finds application in both single layer and multilayer printed circuit boards. The connector itself may be made from cable, ribbon wires, flex board material, etc. It is also contemplated that the connector may be placed in a casing to provide either a rolling or a clampable zero insertion force connector.

Figure 6:
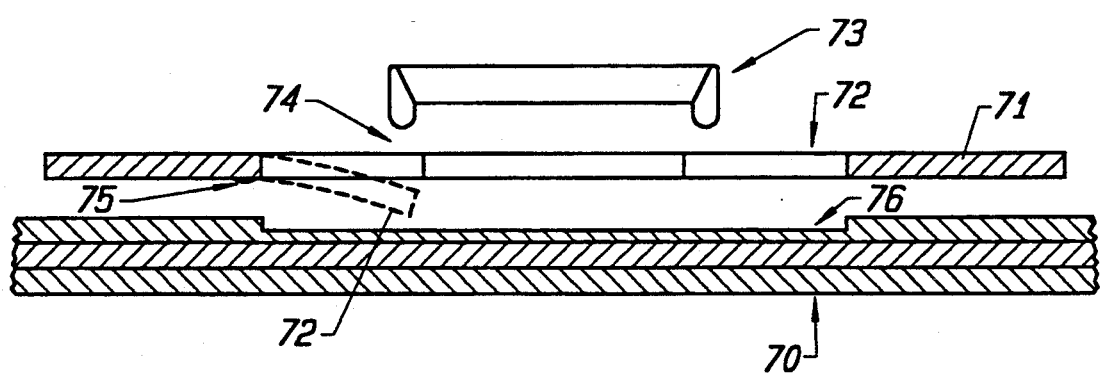
FIG. 6 shows a schematic cross section of a cantilever beam contact scheme in a socket interposer incorporating particle enhanced interconnect according to another embodiment of the invention.

FIG. 6 shows a schematic cross section of a cantilever beam contact scheme in a socket interposer incorporating particle enhanced interconnect according to another embodiment of the invention. In the Fig., a multilayer printed circuit board 70 is formed so as to present a recessed area, such as a cavity 76. A contactor board 71 includes a particle enhanced material contact pattern 75 formed on an under surface thereof. Cantilever beam contacts 72 are provided having a particle enhanced surface 74. The cantilever beam contacts are sometimes referred to as diving board contacts because they are articulated such that the placement of a component, such as a PLCC package 73, onto the contactor board pushes the contacts downwardly. The contacts acts of springs, urging themselves upward in response to the downward pressure, and thus complete the bond.

Figure 7A:
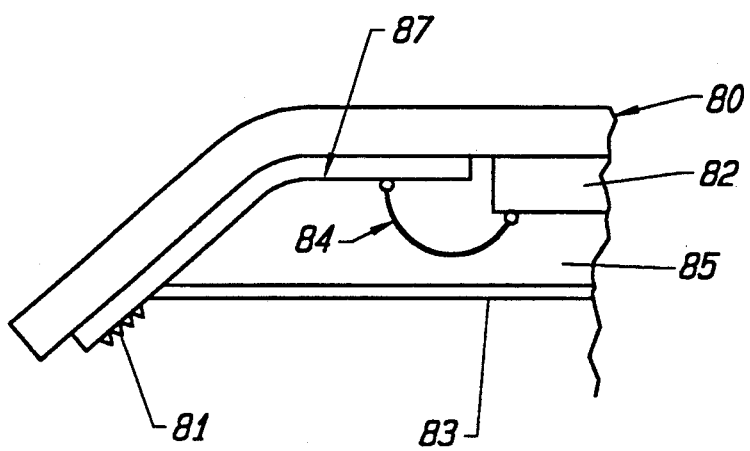
FIGS. 7a-7d show a schematic cross section view of a lead frame incorporating particle enhanced interconnect according to another embodiment of the invention.
Figure 7B:
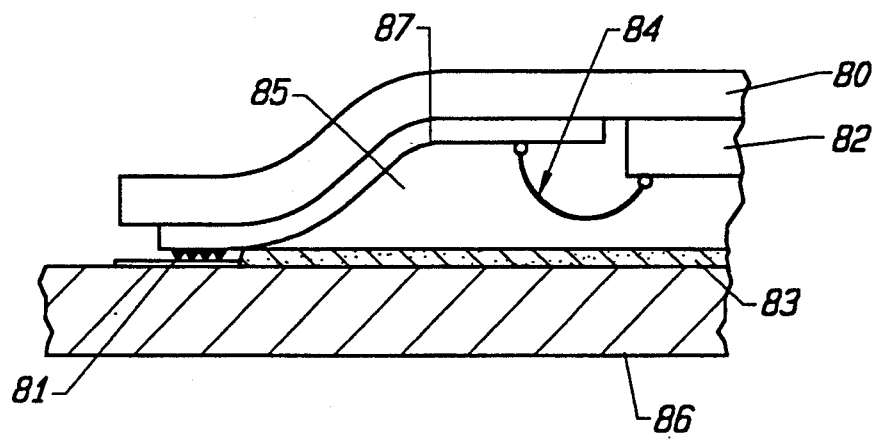
Figure 7C:
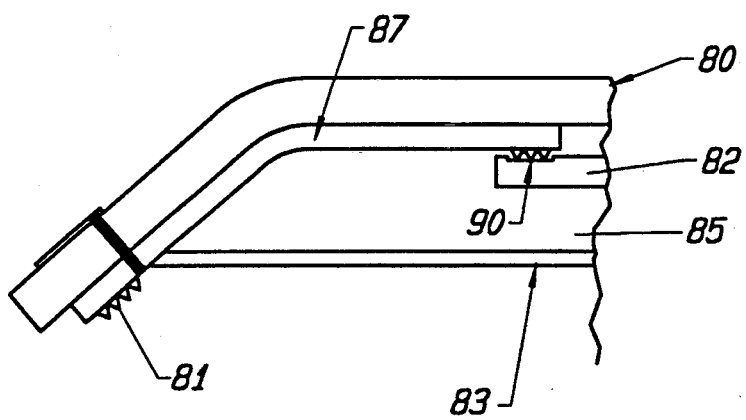

FIGS. 7a–7d show a schematic cross section view of a lead frame incorporating particle enhanced interconnect according to another embodiment of the invention. The embodiment shown in the Figs. is a TAB ILB/-chip-on-board leadframe in which a single or double sided flexible printed circuit board 80 provides a chip-lead frame for an integrated circuit die 82. The lead frame shown may be used in the embodiment of the invention depicted in FIG. 7a where the chip is wire bonded to the lead frame, or it may be used as an alternative to wire bonding in other embodiments of the invention, as shown in FIG. 7c.

In FIG. 7a, a prebonding condition is shown in which a die 82 is wirebonded 84 to a trace 87 on a single sided flexible circuit board 80. The assembly is sealed in an encapsulant 85 and an adhesive 83 is applied to secure the assembly to base board. It will be appreciated that any of the commonly available encapsulants may be used, as well as any suitable adhesive, such as epoxy, tape, etc.

In FIG. 7b, the assembly described above has been mounted to a rigid printed circuit board 86. Interconnection between the assembly and the printed circuit board is established by a particle enhanced contact 81. It can be seen when comparing FIGS. 7a and 7b that the use of a flexible circuit board imparts a bias into the contact and thus aids the process of making a bond between the assembly and the base printed circuit board.

FIG. 7c show an alternative embodiment of the invention discussed above in connection with FIG. 7a. In the embodiment of FIG. 7c, a die 82 is bonded by a particle enhanced material contact 90 to a trace 87 on a single sided flexible circuit board 80. Thus, a die may be contacted through the die bond pads directly to a chip carrier, without the expense and time needed to wirebond the die to the carrier.

Figure 7D:
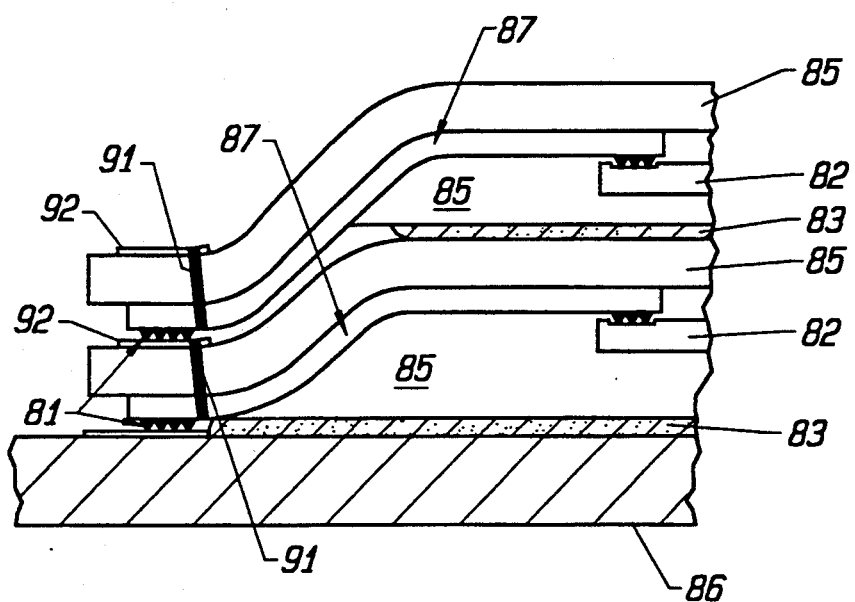

FIG. 7d is a multilayer structure in which the chip carrier of FIG. 7c is configured with a receptor contact 92 on a carrier upper surface such that it may accommodate and bond with a contact of a mating chip carrier. Bonding between the carriers is accomplished with a particle enhanced interconnect on either one or both of the chip carriers' contact surfaces. This embodiment of the invention provides a via 91 that provides a continuous connection through each plane of chip carrier. Chip carriers made in accordance with the teachings of the present invention may be stacked to as many levels as are desired. The high quality bond provided by particle enhanced material allows substantial extension of the chip carriers. In this way a user defined backplane or bus is provided. This embodiment of the invention is therefore useful where various integrated circuits are connected to a common bus, for example memory circuits, processors, and the like. SIMMs made in accordance with the teachings herein could therefore be stacked to provide as much memory as desired without regard to available circuit board space.

Figure 8:
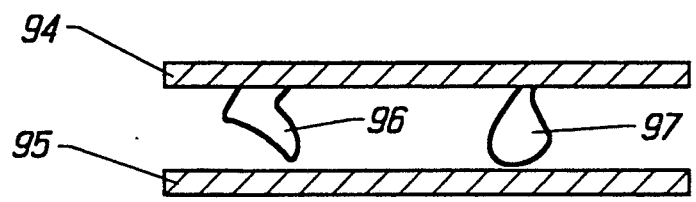
FIG. 8 is a schematic cross section view of a spaced structure according to another embodiment of the invention.

FIG. 8 provides a cross sectional view of a spaced sheet device formed in accordance with another embodiment of the present invention. In the Fig., sheets 94,95 are spaced by particles 96, 97 which are part of a particle enhanced material array. Sheet spacing is a function of particle size. Thus, very close spacings may be achieved having exceptional bonds. The bonding qualities of particle enhanced material allow various useful structures to be made. For example, in one embodiment of the invention the spaced sheets are capacitor plates and the region between the sheets may be a dielectric compound containing particles. A similar construction is used to make a battery or a fuel cell. Additionally, the spacers may define a hollow core through which a coolant fluid may be circulated, such that a microchannel heat exchanger is realized.

This embodiment of the invention allows several layers to be stacked. The spacing of the particles can provide a rigid composite structure (where the particles at each structural layer overlap) or a flexible composite structure (where the particles at each structural layer are staggered).

Although the invention is described herein with reference to the preferred and alternate embodiments, one skilled in the art will readily appreciate that other applications may be substituted for those set forth herein without departing from the spirit and scope of the present invention. Accordingly, the invention should only be limited by the Claims included below.

I claim:

1. An integrated circuit carrier, comprising:
   a terminal array formed on a surface of said integrated circuit carrier, said terminal array including individual contact elements, each contact element having base metal contact layer, including associated particles having a hardness greater than that of said base metal;
   whereby a metal matrix is formed between each terminal array contact element and a corresponding electronic circuit termination when said particles pierce an electronic circuit termination surface.

2. The apparatus of claim 1, wherein at least two of said integrated circuit carriers are stacked to extend a circuit bus along said contact elements.

3. An apparatus for electrically coupling discontinuous component substrates, comprising:
   a first substrate having a terminal array;
   a second substrate having a terminal array;
   a contact layer comprising a base metal formed on each individual terminal of at least one of said terminal arrays, said contact layer on at least one of said terminal arrays including associated particles having a hardness greater than that of said base metal; and
   means for applying compressive force normal to said first substrate and said second substrate;
   whereby a metal matrix is formed between each individual terminal of said first substrate terminal array and a corresponding terminal of said second substrate terminal array when said particles on each individual terminal of said at least one substrate terminal array pierce a surface portion of a corresponding terminal on said other substrate terminal array.

4. The apparatus of claim 3, wherein at least one of said substrates is a flexible substrate.

5. An apparatus for interconnecting a first and a second conventional electronic elements, comprising:
   an interconnect element having a first and a second opposite surface, said interconnect element disposable between said first and said second electronic elements, said interconnect element having a patterned complementary base metal layer on each of said surfaces, said layers including associated particles having a hardness greater than that of said base metal;
   whereby a conductive metal matrix is formed between each of said interconnect element surfaces and a corresponding surface of said first and second electronic elements when said electronic elements are brought into compressive contact with said interconnect element and said particles pierce said electronic element surface.

6. The apparatus of claim 5, further comprising:
   offset first and second electronic elements.

7. The apparatus of claim 6, wherein said interconnect element is flexible.

8. The apparatus of claim 5, further comprising:
   overlapping first and second electronic elements.

9. An apparatus for interconnecting a circuit board to an electronic circuit, comprising:
   a terminal array formed on a surface of said circuit board, said terminal array including individual contact elements, each contact element having base metal contact layer, including associated particles having a hardness greater than that of said base metal; and
   means for applying compressive force normal to said terminal array and an electronic circuit termination;
   whereby a metal matrix is formed between each terminal array contact element and a corresponding electronic circuit termination when said particles pierce an electronic circuit termination surface.

10. The apparatus of claim 9, wherein said circuit board is a single layer board.

11. The apparatus of claim 9, wherein said circuit board is a multilayer board.

12. The apparatus of claim 9, further comprising:
    a ranked terminal array formed on a surface of said circuit board, in which array rows correspond to board layers.

* * * * *